(12) United States Patent
Lee et al.

(10) Patent No.: US 10,943,960 B2
(45) Date of Patent: Mar. 9, 2021

(54) OPTICAL FILTER FOR ANTI-REFLECTION AND ORGANIC LIGHT-EMITTING DEVICE

(71) Applicant: LG CHEM, LTD., Seoul (KR)

(72) Inventors: Eun Hye Lee, Daejeon (KR); Sergey Belyaev, Daejeon (KR); Sin Young Kim, Daejeon (KR); Ji Youn Lee, Daejeon (KR); Moon Soo Park, Daejeon (KR); Hyuk Yoon, Daejeon (KR); Sun Kug Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/480,642

(22) PCT Filed: Jan. 25, 2018

(86) PCT No.: PCT/KR2018/001126
§ 371 (c)(1),
(2) Date: Jul. 24, 2019

(87) PCT Pub. No.: WO2018/139875
PCT Pub. Date: Aug. 2, 2018

(65) Prior Publication Data
US 2020/0043993 A1    Feb. 6, 2020

(30) Foreign Application Priority Data

Jan. 25, 2017  (KR) ................. 10-2017-0011940
Jan. 25, 2018  (KR) ................. 10-2018-0009386

(51) Int. Cl.
*H01L 29/22* (2006.01)
*H01L 27/32* (2006.01)
*G02B 1/11* (2015.01)
*G02F 1/1335* (2006.01)
*H01L 51/52* (2006.01)

(52) U.S. Cl.
CPC ............ *H01L 27/3232* (2013.01); *G02B 1/11* (2013.01); *G02F 1/133536* (2013.01); *H01L 51/5271* (2013.01)

(58) Field of Classification Search
CPC ... H01L 27/3232; H01L 51/5271; G02B 1/11; G02F 1/133536
USPC .......................................................... 257/98
See application file for complete search history.

(56) References Cited

U.S. PATENT DOCUMENTS

| | | | | |
|---|---|---|---|---|
| 9,513,421 B2* | 12/2016 | Oh | ........... | G02B 5/3083 |
| 9,720,280 B2* | 8/2017 | Kim | ........... | G02B 5/3016 |
| 9,835,780 B2* | 12/2017 | Gam | ........... | G02B 5/3033 |
| 2010/0149637 A1 | 6/2010 | Kwon et al. | | |
| 2014/0334001 A1 | 11/2014 | Oh et al. | | |
| 2015/0131031 A1 | 5/2015 | Kim et al. | | |

(Continued)

FOREIGN PATENT DOCUMENTS

| CN | 101568859 A | 10/2009 |
|---|---|---|
| EP | 3067722 A1 | 9/2016 |

(Continued)

*Primary Examiner* — Luan C Thai
(74) *Attorney, Agent, or Firm* — Dentons US LLP

(57) ABSTRACT

The present application relates to an optical filter and an organic light-emitting display device. The optical filter of the present application has excellent omnidirectional anti-reflection performance on the side as well as the front. The optical filter can be applied to an organic light-emitting device to improve visibility.

16 Claims, 4 Drawing Sheets

(56) References Cited

U.S. PATENT DOCUMENTS

| | | |
|---|---|---|
| 2015/0293286 A1 | 10/2015 | Jeon et al. |
| 2015/0378075 A1 | 12/2015 | Gam et al. |
| 2016/0266296 A1 | 9/2016 | Son et al. |

FOREIGN PATENT DOCUMENTS

| | | |
|---|---|---|
| JP | 2004-240012 A | 8/2004 |
| JP | 2004233972 A | 8/2004 |
| JP | 2005-70097 A | 3/2005 |
| JP | 2016-501384 A | 1/2016 |
| JP | 2016-126342 A | 7/2016 |
| KR | 20090122138 A | 11/2009 |
| KR | 101395319 B1 | 5/2014 |
| KR | 10-2015-0055210 A | 5/2015 |
| KR | 1020160001657 A | 1/2016 |
| KR | 1020160079687 A | 7/2016 |
| KR | 1020160142798 A | 12/2016 |
| TW | 201248219 A | 12/2012 |
| TW | 201447395 A | 12/2014 |
| TW | 201447398 A | 12/2014 |
| TW | 201447429 A | 12/2014 |
| WO | 2007/142037 A1 | 12/2007 |
| WO | 2014030814 A1 | 2/2014 |

* cited by examiner

[Figure 1]
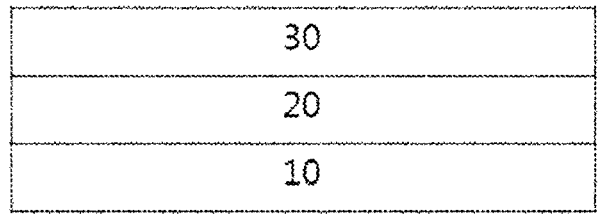
[Figure 2]
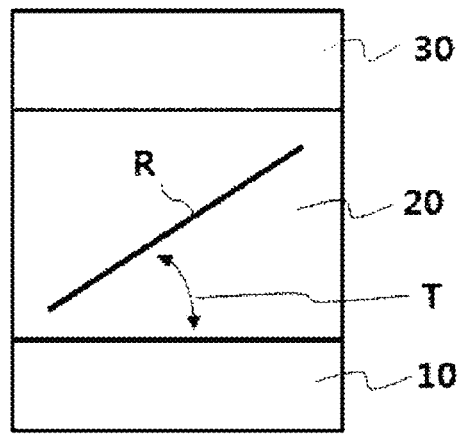
[Figure 3]
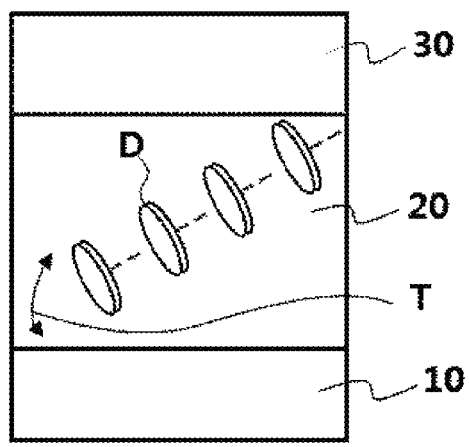

[Figure 4]
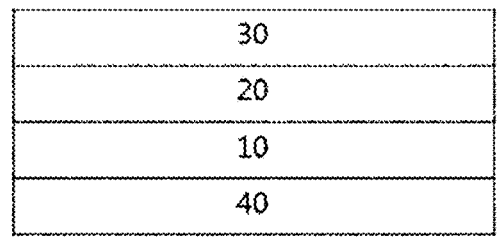
[Figure 5]
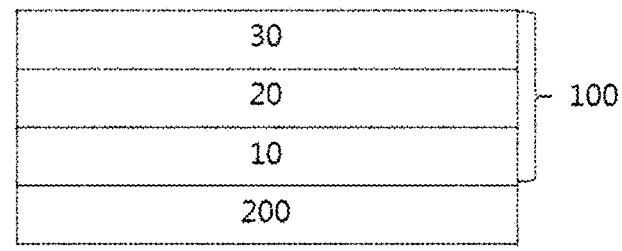
[Figure 6]
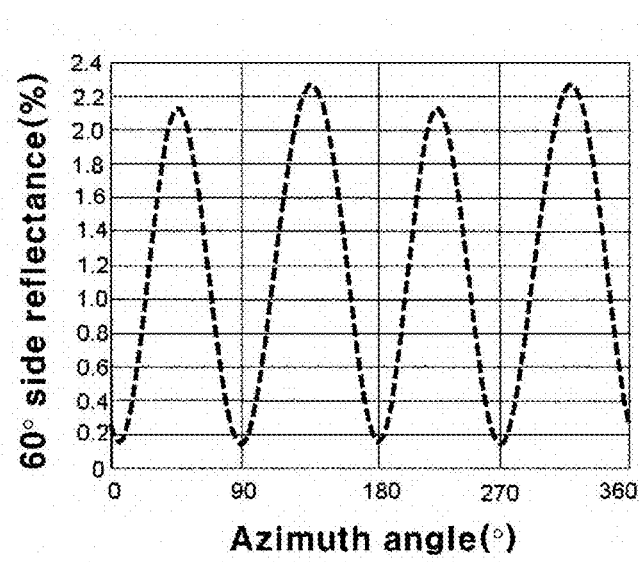

[Figure 7]
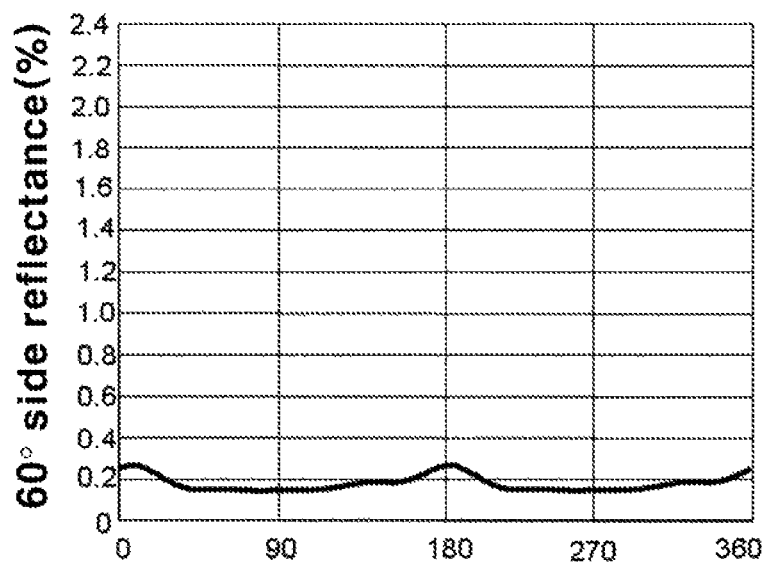
[Figure 8]
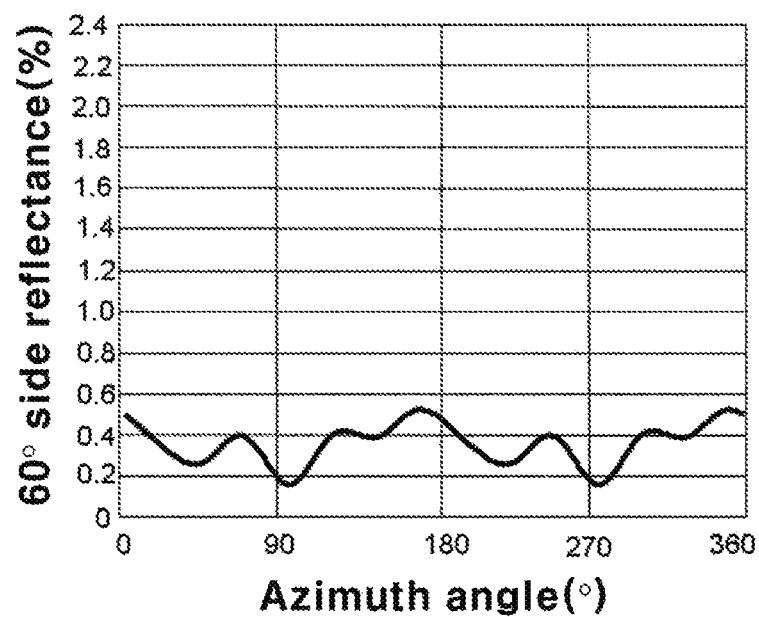

[Figure 9]
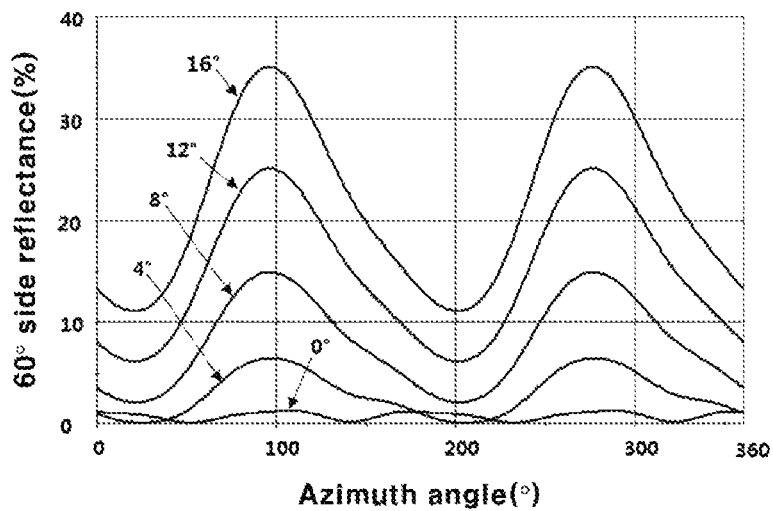

OPTICAL FILTER FOR ANTI-REFLECTION AND ORGANIC LIGHT-EMITTING DEVICE

The present application is a National Phase Entry pursuant to 35 U.S.C. 371 of International Application No PCT/KR2018/001126 filed Jan. 25, 2018, and claims the benefit of and priority to Korean Patent Application No. 10-2017-0011940 filed on Jan. 25, 2017, the disclosures of which are incorporated herein by reference in their entirety.

FIELD

This application relates to an optical filter for anti-reflection and an organic light-emitting device.

BACKGROUND

Recently, there has been a demand for weight reduction and thinning of monitors or televisions, and the like, and organic light-emitting devices (OLEDs) have been attracting attention in response to this demand. The organic light-emitting device is a self-luminescent display device emitting light by itself, which requires no separate backlight, so that the thickness can be reduced, and is advantageous to realize a flexible display device.

On the other hand, the organic light-emitting device can reflect external light by the metal electrode and the metal wiring formed on the organic light-emitting display panel, where visibility and contrast ratio may be lowered due to the reflected external light, thereby deteriorating the display quality. A circular polarizing plate may be attached to one side of the organic light-emitting display panel, as in Patent Document 1 (Korean Laid-Open Patent Publication No. 2009-0122138), to reduce leakage of the reflected external light to the outside.

However, the currently developed circular polarizing plate has strong viewing angle dependence, and thus an antireflection performance deteriorates toward the side, so that there is a problem that the visibility is lowered.

It is a problem to be solved by the present application to provide an optical filter having excellent omnidirectional antireflection performance on the side as well as the front, and an organic light-emitting device having improved visibility by applying an optical filter.

SUMMARY

According to a first aspect, the present invention provides an optical filter for anti-reflection sequentially comprising a first retardation film having an in-plane optical axis and having quarter-wave phase retardation characteristics, a second retardation film having an optical axis constantly tilted along the thickness direction and a polarizer having an absorption axis formed in one direction.

BRIEF DESCRIPTION OF THE DRAWINGS

FIG. 1 is an exemplary cross-sectional diagram of an optical filter according to one example of the present application.

FIG. 2 is an exemplary cross-sectional diagram of an optical filter to which rod-shaped liquid crystal molecules are applied.

FIG. 3 is an exemplary cross-sectional view of an optical filter to which disc-shaped liquid crystal molecules are applied.

FIG. 4 is an exemplary cross-section of an optical filter to which a C-plate is applied.

FIG. 5 is a cross-sectional diagram of an organic light-emitting device according to one example of the present application.

FIG. 6 are the simulation evaluation results of the optical filter of Comparative Example 1.

FIG. 7 are the simulation evaluation results of the optical filter of Example 1.

FIG. 8 are the simulation evaluation results of the optical filter of Example 2.

FIG. 9 are the results of Simulation Evaluation 7.

DETAILED DESCRIPTION

The present application relates to an optical filter for anti-reflection. FIG. 1 illustratively shows the optical filter. As shown in FIG. 1, the optical filter may comprise a first retardation film (10), a second retardation film (20) and a polarizer (30), sequentially. The first retardation film may have an in-plane optical axis and quarter-wave phase retardation characteristics. The second retardation film may have an optical axis that is constantly tilted along the thickness direction. The second retardation film having such characteristics can be referred to as a constant tilt film. The polarizer (30) may have an absorption axis formed in one direction.

In this specification, a polarizer means an element exhibiting selective transmission and absorption characteristics with respect to incident light. For example, the polarizer can transmit light that vibrates in any one direction from incident light that vibrates in various directions, and absorb light that vibrates in the other directions.

The polarizer (30) included in the optical filter may be a linear polarizer. In this specification, the linear polarizer means a case where the selectively transmitting light is a linearly polarized light that vibrates in any one direction and the selectively absorbing light is a linearly polarized light that vibrates in a direction orthogonal to the vibration direction of the linearly polarized light.

As the linear polarizer, for example, a polarizer in which iodine is dyed on a polymer stretched film such as a PVA stretched film or a guest-host polarizer in which a liquid crystal polymerized in an oriented state is used as a host and an anisotropic dye arranged depending on the orientation of the liquid crystal is used as a guest may be used, without being limited thereto.

According to one example of the present application, a PVA stretched film can be used as the polarizer (30). The transmittance or polarization degree of the polarizer can be appropriately adjusted in consideration of the object of the present application. For example, the transmittance of the polarizer may be from 42.5% to 55%, and the polarization degree may be from 65% to 99.9997%.

In this specification, when the term such as vertical, horizontal, orthogonal or parallel is used while defining an angle, it means substantially vertical, horizontal, orthogonal, or parallel to the extent that the desired effect is not impaired, which includes, for example, an error that takes a production error or a deviation (variation), and the like, into account. For example, each case of the foregoing may include an error within about ±15 degrees, an error within about ±10 degrees or an error within about ±5 degrees.

In this specification, the retardation film (20) is an optically anisotropic element, which may mean an element capable of converting incident polarized light by controlling birefringence. While describing an x-axis, y-axis and z-axis of the retardation film herein, unless otherwise specified, the x-axis means a direction parallel to an in-plane slow axis of the retardation film, the y-axis means a direction parallel to an in-plane fast axis of the retardation film, and the z-axis means a thickness direction of the retardation film. The x-axis and y-axis may be orthogonal to each other in the plane. In this specification, when the retardation film comprises rod-shaped liquid crystal molecules, the slow axis may mean the long axis direction of the rod shape, and when it comprises disc-shaped liquid crystal molecules, the slow axis may mean the normal direction of the disc shape. While describing an optical axis of the retardation film herein, unless otherwise specified, it means a slow axis. While describing the refractive index of the retardation film herein, unless otherwise specified, it means a refractive index for light of a wavelength of about 550 nm.

In this specification, the in-plane retardation (Rin) of the retardation film (20) is calculated by Equation 1 below.

$$Rin = d \times (nx - ny) \qquad \text{[Equation 1]}$$

In Equation 1, Rin is an in-plane retardation, d is a thickness of the retardation film, and nx and ny are refractive indexes in the x-axis and y-axis directions as defined above, respectively. While describing the in-plane retardation of the retardation film (20) herein, unless otherwise specified, it means an in-plane retardation for light of a wavelength of about 550 nm.

In this specification, the reverse wavelength dispersion characteristic may mean a characteristic satisfying Equation 2 below, the normal wavelength dispersion characteristic may mean a characteristic satisfying Equation 3 below, and the flat wavelength dispersion characteristic may mean a characteristic satisfying Equation 4 below.

$$R(450)/R(550) < R(650)/R(550) \qquad \text{[Equation 2]}$$

$$R(450)/R(550) > R(650)/R(550) \qquad \text{[Equation 3]}$$

$$R(450)/R(550) = R(650)/R(550) \qquad \text{[Equation 4]}$$

In Equations 2 to 4, R (λ) is an in-plane retardation of the retardation film for light of λ nm.

In this specification, the retardation film satisfying Equation 5 below can be called a so-called +A plate. In this specification, the retardation film satisfying Equation 6 below can be called a so-called +C plate.

$$nx > ny = nz \qquad \text{[Equation 5]}$$

$$nx = ny < nz \qquad \text{[Equation 6]}$$

In Equations 5 to 6, nx, ny and nz are refractive indexes in the x-axis, y-axis and z-axis directions as defined above, respectively.

The optical filter may sequentially comprise a first retardation film (10), a second retardation film (20) and a polarizer (30). If this arrangement order is satisfied, it may be advantageous to improve omnidirectional antireflection performance on the side as well as the front.

The first retardation film (10) may have an in-plane optical axis. That is, the first retardation film may have an optical axis parallel to the plane direction. The optical axis of the first retardation film may form about 40 degrees to 50 degrees, about 43 degrees to 47 degrees, specifically about 45 degrees with the absorption axis of the polarizer. When the optical axis of the first retardation film and the absorption axis of the polarizer (30) form the angle range, it may be advantageous to improve omnidirectional antireflection performance on the side as well as the front.

The first retardation film (10) may have a quarter-wave phase retardation characteristic. In this specification, the term "n-wave phase retardation characteristic" may mean a characteristic that the incident light may be phase-delayed by n times the wavelength of the incident light within at least a part of the wavelength range. Therefore, the quarter-wave phase retardation characteristic may mean a characteristic that the incident light may be phase-delayed by a quarter times the wavelength of the incident light within at least a part of the wavelength range. The in-plane retardation of the first retardation film for light having a wavelength of 550 nm may be 120 nm to 160 nm. Specifically, the in-plane retardation may be 120 nm or more, 130 nm or more, 135 nm or more, 160 nm or less, 150 nm or less, or 140 nm or less.

The first retardation film (10) may have reverse wavelength dispersion characteristics. For example, the first retardation film may have a property that the in-plane retardation increases, as the wavelength of incident light increases. The incident light may be, for example, 300 nm to 800 nm.

In one example, the R (450)/R (550) value of the first retardation film may be 0.99 or less. In one example, the R (450)/R (550) value may be in a range of 0.6 to 0.99. The R (450)/R (550) value may be, for example, 0.6 or more, 0.65 or more, 0.7 or more, or 0.75 or more, and may be 0.99 or less, 0.95 or less, 0.9 or less, 0.85 or less, or 0.8 or less. The value of R (650)/R (550) of the first retardation film has a value larger than the value of the R (450)/R (550), which may be 1.01 to 1.19, 1.05 to 1.15, or 1.09 to 1.11.

The first retardation film (10) may be a uniaxial retardation film. For example, the first retardation film may be a +A plate satisfying Equation 5 above.

The first retardation film (10) may be a polymer film. As the polymer film, a film comprising polyolefin such as PC (polycarbonate), norbornene resin, PVA (poly(vinyl alcohol)), PS (polystyrene), PMMA (poly(methyl methacrylate) and PP (polypropylene), Par (poly(arylate)), PA (polyamide), PET (poly(ethylene terephthalate)) or PS (polysulfone), and the like can be used. The polymer film may be stretched or shrunk under appropriate conditions to impart birefringence and used as the first retardation films.

The first retardation film (10) may be a liquid crystal film. The liquid crystal film may comprise liquid crystal molecules in a state of being oriented and polymerized. The liquid crystal molecule may be a polymerizable liquid crystal molecule. In this specification, the polymerizable liquid crystal molecule may mean a molecule containing a moiety capable of exhibiting liquid crystallinity, such as a mesogen skeleton, and containing at least one polymerizable functional group. Also, the fact to comprise polymerizable liquid crystal molecules in a polymerized form may mean a state in which the liquid crystal molecules are polymerized to form a skeleton such as a main chain or side chain of the liquid crystal polymer in the liquid crystal film. The liquid crystal film may comprise the liquid crystal molecules, for example, in a horizontally oriented state. In this specification, "horizontal orientation" may mean a state where the slow axis of the liquid crystal film containing liquid crystal molecules is oriented horizontally with respect to the plane of the liquid crystal film.

The second retardation film (20) may have an optical axis uniformly tilted along the thickness direction. In this specification, the fact that an optical axis is tilted may mean that the optical axis is tilted at a certain angle with respect to the plane of the retardation film. In this specification, the tilt angle may mean the minimum angle formed by the optical axis and the plane of the retardation film. In one example, when the second retardation film comprises rod-shaped liquid crystal molecules, the tilt angle may mean an angle formed by the long axis direction of the rod shape and the plane of the retardation film. In another example, when the second retardation film comprises disc-shaped liquid crystal molecules, the tilt angle may mean an angle formed by the normal direction of the disc and the plane of the retardation film. The tilt angle may be, for example, more than 0 degrees and less than 90 degrees and the range of the tilt angle can be appropriately adjusted in consideration of the antireflection performance, as described below.

The tilt direction of the optical axis of the second retardation film (20) can be parallel to the absorption axis of the polarizer (30). The term tilt direction of the optical axis herein may mean projection of the optical axis onto the plane of the second retardation film. When the tilt direction of the optical axis of the second retardation film and the absorption axis of the polarizer are parallel to each other, it may be advantageous to improve omnidirectional antireflection performance on the side as well as the front. The tilt direction of the optical axis of the second retardation film and the absorption axis of the polarizer may form, for example, an angle of 0 degrees or more and may form less than 4 degrees, 3.5 degrees or less, 3 degrees or less, 2.5 degrees or less, 2 degrees or less, 1.5 degrees or less, 1 degree or less, or 0.5 degrees or less, and preferably may form 0 degrees.

The second retardation film (20) may have, for example, a thickness of 0.3 μm to 3 μm. It is possible to provide an optical filter having excellent antireflection characteristics in all directions within the above thickness range. The thickness of the second retardation film can be adjusted within the above range according to the structure of the optical filter as described below, thereby further improving the omnidirectional antireflection characteristics.

The second retardation film (20) may have reverse wavelength dispersion characteristics. The details of the reverse wavelength dispersion characteristics may be applied equally by those described in the item of the first retardation film. In one example, the R (450)/R (550) value of the second retardation film may be 0.77 to 0.99, preferably 0.82 to 0.95. When the second retardation film has reverse wavelength dispersion characteristics, an effect of further improving the reflectance characteristic can be obtained.

The second retardation film (20) may comprise a liquid crystal layer. The liquid crystal layer may comprise liquid crystal molecules. The liquid crystal layer may comprise liquid crystal molecules having an absolute value of refractive index anisotropy of 0.01 to 0.25. In this specification, the refractive index anisotropy (Δn) may mean a value of extraordinary refractive index (ne)–ordinary refractive index (no). In this specification, the extraordinary refractive index may mean the refractive index in the slow axis direction of the liquid crystal layer, and the ordinary refractive index may mean the refractive index in the fast axis direction of the liquid crystal layer. The refractive index anisotropy may be, for example, 0.01 or more, 0.03 or more, 0.04 or more, or 0.05 or more, and may be 0.25 or less, 0.2 or less, 0.18 or less, 0.16 or less, 0.14 or less, or 0.12 or less. In one example, the refractive index anisotropy value may be positive when the liquid crystal layer comprises rod-shaped liquid crystal molecules and the refractive index anisotropy value may be negative when it comprises disc-shaped liquid crystal molecules.

The liquid crystal layer may comprise rod-shaped liquid crystal molecules or disc-shaped liquid crystal molecules.

The rod-shaped liquid crystal molecule may comprise a compound having a rod-like structure, the molecular structure of which is substituted by a linear alkyl group or alkoxy group, a substituted benzoyloxy group or the like, and showing liquid crystallinity. As such rod-shaped liquid crystal molecules, a liquid crystal compound known to form a so-called nematic phase can be used. In this specification, the term "nematic phase" may mean a liquid crystal phase sequentially arranged along the long axis direction without regularity for the position of the liquid crystal molecules. In one example, the rod-shaped liquid crystal compound may have a crosslinkable or polymerizable functional group. The crosslinkable or polymerizable functional group is not particularly limited, but may be exemplified by, for example, an alkenyl group, an epoxy group, a cyano group, a carboxyl group, an acryloyl group, a methacryloyl group, an acryloyloxy group or a methacryloyloxy group.

The disc-shaped liquid crystal molecule may comprise a compound having a discotic structure, in which the molecule center is a mother nucleus and a linear alkyl group or alkoxy group, a substituted benzoyloxy group or the like is radially substituted as a linear chain, and showing liquid crystallinity. As such disc-shaped liquid crystal molecules, a liquid crystal compound known to form a so-called discotic phase can be used. In general, a disc-shaped liquid crystal compound is one having a negative refractive index anisotropy (uniaxial), which may include, for example, benzene derivatives described in C. Destrade et al. Mol. Cryst. Vol. 71, page 111 (1981); cyclohexane derivatives described in B. Kohne et al. Angew. Chem. Vol. 96, page 70 (1984); and azacrown-based or phenylacetylene-based macrocycles described in J. Zhang et al., J. Am. Chem. Soc. Vol. 116, page 2655 (1994), and the like. In one example, the discotic phase liquid crystal compound may have a crosslinkable or polymerizable functional group. The crosslinkable or polymerizable functional group is not particularly limited, but may be exemplified by, for example, an alkenyl group, an epoxy group, a cyano group, a carboxyl group, an acryloyl group, a methacryloyl group, an acryloyloxy group or a methacryloyloxy group.

The liquid crystal layer may comprise the liquid crystal molecules in a tilted alignment state. In this specification, the tilted alignment may mean an alignment state where the liquid crystal molecules are aligned so as to be tilted at a certain angle with respect to the plane of the liquid crystal layer, and specifically, a state in which they are not vertically or horizontally aligned. Specifically, the tilted alignment may mean an alignment state where the difference in tilt angle of all the liquid crystal molecules in the liquid crystal layer is ±5 degrees or less, ±3 degrees or less, or ±1 degree or less, and preferably all the liquid crystal molecules have the same tilt angle. Specifically, the tilted alignment may mean an alignment state where the graph shown by defining the thickness of the liquid crystal layer as the x-axis and defining the local tilt angle corresponding to the thickness as the y-axis is a graph in which the slope is adjacent to zero.

The tilt angle of the optical axis of the second retardation film may be, for example, 10 degrees to 65 degrees. It is possible to provide an optical filter having excellent antireflection characteristics in all directions within the tilt angle range. The tilt angle of the optical axis of the second retardation film may be adjusted within the above range according to the structure of the optical filter described below, thereby further improving the omnidirectional antireflection characteristics.

FIG. 2 exemplarily shows an optical filter comprising a second retardation film (20) including rod-shaped liquid crystal molecules (R). FIG. 3 exemplarily shows an optical filter comprising a second retardation film (20) including disc-shaped liquid crystal molecules (D).

The tilted alignment of the liquid crystal molecules can be performed by a tilted alignment method of liquid crystals known in the art. For example, the tilted alignment can be induced by coating liquid crystal molecules on a photo alignment film formed by radiating an ultraviolet ray obliquely or applying a magnetic field to the liquid crystal layer.

The optical filter of the present application can effectively improve antireflection performance on the side as well as the front by controlling the optical properties of the second retardation film.

In one example, the second retardation film (20) may comprise rod-shaped liquid crystal molecules (R). In this case, the tilt angle T of the optical axis of the second retardation film may be 25 degrees to 65 degrees. The tilt angle T may be, for example, 25 degrees or more, 30 degrees or more, or 35 degrees or more, and may be 65 degrees or less, 60 degrees or less, 55 degrees or less, or 50 degrees or less. In this case, the second retardation film (20) may have a thickness of 0.35 μm to 2.2 μm. The thickness may be specifically 0.35 μm or more, or 0.4 μm or more, and may be 2.2 μm or less, 2.0 μm or less, or 1.8 μm or less. When the second retardation film is applied thereto, the optical filter has a reflectance of about 1% or less at the front, which can exhibit excellent antireflection performance.

When the second retardation film (20) comprises rod-shaped liquid crystal molecules (R), the tilt angle T of the optical axis of the second retardation film may be 35 degrees to 50 degrees. In this case, the second retardation film (20) may have a thickness of 0.4 μm to 2.2 μm. When the second retardation film is applied thereto, the optical filter has a reflectance of less than about 1%, 0.8% or less, 0.6% or less, 0.5% or less, or 0.4% or less at the 60 degree side, which can exhibit improved antireflection performance.

When the second retardation film (20) comprises rod-shaped liquid crystal molecules (R), the thickness of the second retardation film (20) for effectively improving the antireflection performance at the 60 degree side can be adjusted according to the refractive index anisotropy of the liquid crystal molecules. In one example, when the refractive index anisotropy of the liquid crystal molecules is 0.04 to 0.06, the tilt angle of the optical axis of the second retardation film is 35 degrees to 50 degrees, and if the thickness of the second retardation film is 1.8 μm to 2.2 μm, it is possible to exhibit improved antireflection performance at the 60 degree side. In another example, when the refractive index anisotropy of the liquid crystal molecules is 0.07 to 0.09, the tilt angle of the optical axis of the second retardation film is 35 degrees to 50 degrees, and if the thickness of the second retardation film is 1.15 μm to 1.3 μm, it is possible to exhibit improved antireflection performance at the 60 degree side. In another example, when the refractive index anisotropy of the liquid crystal molecules is 0.1 to 0.14, the tilt angle of the optical axis of the second retardation film is 35 degrees to 50 degrees, and if the thickness of the second retardation film is 0.8 μm to 0.9 μm, it is possible to exhibit improved antireflection performance at the 60 degree side. In another example, when the refractive index anisotropy of the liquid crystal molecules is 0.2 to 0.3, specifically 0.24 to 0.26, the tilt angle of the optical axis of the second retardation film is 35 to 50 degrees, and if the thickness of the second retardation film is 0.35 μm to 0.45 μm, specifically 0.4 μm, it is possible to exhibit improved antireflection performance at the 60 degree side. In one example, the second retardation film may comprise disc-shaped liquid crystal molecules (D). In this case, the tilt angle T of the optical axis of the second retardation film may be 10 degrees to 35 degrees. The tilt angle T may be, for example, 10 degrees or more, 15 degrees or more, or 20 degrees or more, and may be 35 degrees or less, or 30 degrees or less. In this case, the second retardation film (20) may have a thickness of 1 μm to 3 μm. The thickness may be, for example, 1 μm or more, 1.25 μm or more, or 1.5 μm or more, and may be 3 μm or less. When the second retardation film is applied thereto, the optical filter has a reflectance of about 1% or less at the front, which can exhibit excellent antireflection performance.

When the second retardation film (20) comprises disc-shaped liquid crystal molecules (D), the tilt angle T of the optical axis of the second retardation film may be, for example, 20 degrees to 30 degrees. In this case, the second retardation film may have a thickness of 1.05 μm to 2.95 μm. When the second retardation film is applied thereto, the optical filter has a reflectance of less than about 1%, 0.8% or less, or 0.6% or less at the 60 degree side, which can exhibit improved antireflection performance.

When the second retardation film (20) comprises disc-shaped liquid crystal molecules (D), the second retardation film for effectively improving the antireflection performance at the 60 degree side can be adjusted according to the refractive index anisotropy of the liquid crystal molecule. In one example, when the refractive index anisotropy of the liquid crystal molecules is 0.07 to 0.09, the tilt angle T of the optical axis of the second retardation film is 20 degrees to 30 degrees, and if the thickness of the second retardation film is 2.2 μm to 2.6 μm, it is possible to exhibit improved antireflection performance at the 60 degree side. In another example, when the refractive index anisotropy of the liquid crystal molecules is 0.1 to 0.14, the tilt angle of the optical axis of the second retardation film is 20 degrees to 30 degrees, and if the thickness of the second retardation film is 1.5 μm to 1.85 μm, it is possible to exhibit improved antireflection performance at the 60 degree side.

When the second retardation film (20) comprises rod-shaped liquid crystal molecules (R), the in-plane retardation of the second retardation film for light having a wavelength of 550 nm may be 90 nm to 105 nm. When the second retardation film comprises disc-shaped liquid crystal molecules (D), the in-plane retardation of the second retardation film for light having a wavelength of 550 nm may be 160 nm to 250 nm.

As described above, while the second retardation film (20) comprises rod-shaped (R) or disc-shaped (D) liquid crystal molecules, the antireflection performance can be improved on the side as well as the front by appropriately adjusting the tilt angle T, the thickness or the like. In one example, the case in which the second retardation film comprises rod-shaped liquid crystal molecules may be more advantageous in improving omnidirectional antireflection performance on the side as compared with the case in which it comprises disc-shaped liquid crystal molecules.

The optical filter may further comprise a C plate (40). As shown in FIG. 4, the C plate (40) may be disposed on the outer side of the first retardation film (10), that is, on the opposite side from where the second retardation film (20) is disposed.

The C plate (40) may comprise a polymer material or a UV curable liquid crystal film. As the usable film, a homeotropic aligned liquid crystal film, a biaxially stretched PC (polycarbonate) or the like may be included.

The optical filter may further comprise a surface treatment layer. The surface treatment layer may be exemplified by an antireflection layer or the like. The surface treatment layer may be disposed on the outer side of the polarizer (30), that is, on the opposite side where the second retardation film (20) is disposed. As the antireflection layer, a laminate of two or more layers having different refractive indexes or the like may be used, without being limited thereto.

The first retardation film (10), the second retardation film (20), and the polarizer (30) of the optical filter may be attached to each other through a pressure-sensitive adhesive or an adhesive, or may be laminated to each other by direct coating. An optical transparent pressure-sensitive adhesive or adhesive may be used as the pressure-sensitive adhesive or adhesive.

The optical filter may have excellent ominidirectional antireflection performance on the side as well as the front. The optical filter may have, for example, a reflectance of 1% or less as measured at the front. The optical filter may have, for example, a reflectance of less than 1%, 0.8% or less, 0.6% or less, 0.5% or less, or 0.4% or less as measured at the 60 degree side based on the front. The reflectance may be a reflectance for light of any wavelength in the visible light region, for example, a reflectance for light of any wavelength in a range of 380 nm to 780 nm, or a reflectance for light belonging to the entire visible light region. The reflectance may be, for example, the reflectance measured on the polarizer side of the optical filter. The reflectance at the 60 degree side may mean the minimum reflectance of the reflectance measured in all directions of 0 to 360 degrees at the 60 degree side, may mean all reflectance measured in all directions of 0 to 360 degrees, or may mean the average reflectance of the reflectance measured in all directions.

The optical filter of the present application can prevent the reflection of external light, thereby improving the visibility of the organic light-emitting device. While incident unpolarized light (hereinafter referred to as "external light") incident from the outside passes through a polarizer (30), one polarized orthogonal component, that is, a first polarized orthogonal component, of two polarized orthogonal components may be only transmitted and the polarized light may be changed to circularly polarized light while passing through the first retardation film (10). While the circularly polarized light is reflected from a display panel of an organic light-emitting display device comprising a substrate, an electrode, and the like, the rotational direction of the circularly polarized light is changed and the circularly polarized light is converted to the other polarized orthogonal component of two polarized orthogonal components, that is, a second polarized orthogonal component while passing through the first retardation film again. The second polarized orthogonal component does not pass through the polarizer and thus does not emit light to the outside, so that it can have an effect of preventing reflection of external light.

The optical filter of the present application can also effectively prevent the reflection of external light incident from the side, thereby improving the lateral visibility of the organic light-emitting device. For example, it is also possible to effectively prevent the reflection of external light incident from the side through viewing angle polarization compensation principle.

The optical filter of the present application can be applied to an organic light-emitting device. FIG. 5 is a cross-sectional diagram exemplarily showing an organic light-emitting device. Referring to FIG. 5, the organic light-emitting device comprises an organic light-emitting display panel (200) and an optical filter (100) positioned on one side of the organic light-emitting display panel (200). The first retardation film (30) of the optical filter may be disposed adjacent to the organic light-emitting display panel (200) as compared with the polarizer (10).

The organic light-emitting display panel (200) may comprise a base substrate, a lower electrode, an organic light-emitting layer, an upper electrode and a sealing substrate, and the like. One of the lower electrode and the upper electrode may be an anode and the other may be a cathode. The anode is an electrode into which holes are injected, which may be made of a conductive material having a high work function, and the cathode is an electrode into which electrons are injected, which may be made of a conductive material having a low work function. At least one of the lower electrode and the upper electrode may be made of a transparent conductive material that the emitted light can come out to the outside, and may be, for example, ITO or IZO. The organic light-emitting layer may comprise an organic material capable of emitting light when a voltage has been applied to the lower electrode and the upper electrode.

Additional layers may be further included between the lower electrode and the organic light-emitting layer and between the upper electrode and the organic light-emitting layer. The additional layer may include a hole transporting layer, a hole injecting layer, an electron injecting layer and an electron transporting layer for balancing electrons and holes, but is not limited thereto. The sealing substrate may be made of glass, metal, and/or a polymer, and may seal the lower electrode, the organic light-emitting layer, and the upper electrode to prevent moisture and/or oxygen from being introduced from the outside.

The optical filter (100) may be disposed on the side where the light comes out from the organic light-emitting display panel (200). For example, in the case of a bottom emission structure in which light is emitted toward the base substrate, it may be disposed outside the base substrate, and in the case of a top emission structure in which light is emitted toward the sealing substrate, it may be disposed outside the sealing substrate. The optical filter (100) can improve display characteristics of the organic light-emitting device by preventing external light from being reflected by the reflective layer made of metal such as electrodes and wiring of the organic light-emitting display panel (200) and from coming out of the organic light-emitting device. In addition, since the optical filter (100) can exhibit an antireflection effect on the side as well as the front, as described above, the lateral visibility can be improved.

The optical filter of the present application has excellent omnidirectional antireflection performance on the side as well as the front, and the optical filter can be applied to an organic light-emitting device to improve visibility.

Examples

Hereinafter, the contents will be described in more detail through Examples and Comparative Examples, but the scope of the present application is not limited to the following contents.

Simulation Evaluation 1

For simulation evaluation (Dimos software, AUTRONIC-MELCHERS), a structure was set, where a reflective plate having a reflectance of 50% in all wavelengths of visible light, a first retardation film, a second retardation film and a polarizer were sequentially arranged. The polarizer was set so that it had an absorption axis in one direction and a single transmittance (Ts) of 42.5% and to a structure in which a TAC (triacetyl cellulose) film having no retardation was laminated. The second retardation film was set so that it comprised rod-shaped liquid crystal molecules having refractive index anisotropy ($\Delta n$) of 0.08 and had an optical axis tilted uniformly along the thickness direction (constant tilt film). The projection of the optical axis of the second retardation film onto the plane was set to be parallel (0 degrees) with the absorption axis of the polarizer. The first retardation film was set so that it had an in-plane optical axis, the Rin value for a wavelength of 550 nm was 137 nm and the R (450)/R (550) was 0.77. The optical axis of the first retardation film was set to form 45 degrees with the absorption axis of the polarizer. Table 1 below shows the simulation evaluation results of the thickness of the second retardation film having the front reflectance of 1% or less according to the tilt angle of the optical axis of the second retardation film. In addition, Table 1 below shows the simulation evaluation results of the minimum reflectance of the reflectance measured in all directions of 0 to 360 degrees at the 60 degree side based on the front and the thickness of the second retardation film for the occasion. The reflectance is a value measured at the polarizer side for a wavelength of 550 nm.

TABLE 1

| Tilt angle of optical axis of second retardation film (°) | Thickness of second retardation film having a front reflectance of 1% or less (μm) | 60° side | |
|---|---|---|---|
| | | Minimum reflectance (%) | Thickness (μm) |
| 25 | — | 0.98 | 1.25 |
| 30 | 0.82 to 1.7 | 0.65 | 1.25 |
| 35 | 0.7 to 1.8 | 0.38 | 1.3 |
| 40 | 0.62 to 1.84 | 0.25 | 1.3 |
| 45 | 0.6 to 1.84 | 0.25 | 1.2 |
| 50 | 0.6 to 1.75 | 0.32 | 1.15 |
| 55 | 0.6 to 1.55 | 0.58 | 1.1 |
| 60 | 0.5 to 1.3 | 0.9 | 0.9 |
| 65 | — | 1.2 | 0.7 |

Simulation Evaluation 2

Simulation evaluation was performed in the same manner as in Simulation 1, except that the second retardation film was set to comprise rod-shaped liquid crystal molecules having refractive index anisotropy ($\Delta n$) of 0.12, and the results were described in Table 2 below.

TABLE 2

| Tilt angle of optical axis of second retardation film (°) | Thickness of second retardation film having a front reflectance of 1% or less (μm) | 60° side | |
|---|---|---|---|
| | | Minimum reflectance (%) | Thickness (μm) |
| 25 | — | 1 | 0.8 |
| 30 | 0.58 to 1.1 | 0.67 | 0.85 |
| 35 | 0.52 to 1.2 | 0.38 | 0.85 |
| 40 | 0.42 to 1.23 | 0.25 | 0.9 |
| 45 | 0.4 to 1.23 | 0.25 | 0.87 |
| 50 | 0.4 to 1.2 | 0.33 | 0.8 |
| 55 | 0.4 to 1.04 | 0.6 | 0.8 |
| 60 | 0.45 to 0.75 | 0.91 | 0.6 |
| 65 | — | 1.2 | 0.5 |

Simulation Evaluation 3

Simulation evaluation was prepared in the same manner as in Simulation 1, except that the second retardation film was set to comprise rod-shaped liquid crystal molecules having refractive index anisotropy ($\Delta n$) of 0.05, 0.08, 0.12 and 0.25, respectively. Table 3 below shows the simulation evaluation results of the minimum reflectance measured in the lateral direction at 60 degrees from the front and the thickness of the second retardation film for the occasion, in accordance with the tilt angle of the optical axis and the refractive index anisotropy of the second retardation film.

TABLE 3

| Tilt angle of optical axis of second retardation film (°) | Minimum reflectance at the 60 degree side, % (thickness, μm) | | | |
|---|---|---|---|---|
| | $\Delta n = 0.05$ | $\Delta n = 0.08$ | $\Delta = 0.12$ | $\Delta n = 0.25$ |
| 35 | 0.33 (2.1) | 0.38 (1.3) | 0.38 (0.85) | 0.4 (0.4) |
| 40 | 0.25 (2.2) | 0.25 (1.3) | 0.25 (0.9) | 0.28 (0.4) |
| 45 | 0.25 (1.95) | 0.25 (1.2) | 0.25 (0.87) | 0.25 (0.4) |
| 50 | 0.32 (1.8) | 0.32 (1.15) | 0.33 (0.8) | 0.35 (0.4) |

Simulation Evaluation 4

Simulation evaluation was performed in the same manner as Simulation Evaluation 1, except that the second retardation film was set to comprise disc-shaped liquid crystal molecules having refractive index anisotropy ($\Delta n$) of −0.08, and the results were described in Table 4 below.

TABLE 4

| Tilt angle of optical axis of second retardation film (°) | Thickness of second retardation film having a front reflectance of 1% or less (μm) | 60° side | |
|---|---|---|---|
| | | Minimum reflectance (%) | Thickness (μm) |
| 10 | — | 1.2 | 2.9 |
| 15 | 1.9 to 3.0 | 0.78 | 2.7 |
| 20 | 1.58 to 2.95 | 0.5 | 2.6 |
| 25 | 1.5 to 2.8 | 0.45 | 2.5 |
| 30 | 1.5 to 2.6 | 0.55 | 2.2 |
| 35 | — | 1.1 | 2.0 |

Simulation Evaluation 5

Simulation evaluation was performed in the same manner as Simulation Evaluation 1, except that the second retardation film was set to comprise disc-shaped liquid crystal molecules having refractive index anisotropy ($\Delta n$) of −0.12, and the results were described in Table 5 below.

TABLE 5

| Tilt angle of optical axis of second retardation film (°) | Thickness of second retardation film having a front reflectance of 1% or less (μm) | 60° side | |
|---|---|---|---|
| | | Minimum reflectance (%) | Thickness (μm) |
| 10 | — | 1.15 | 2.15 |
| 15 | 1.37 to 2.12 | 0.8 | 2.95 |
| 20 | 1.12 to 2.05 | 0.55 | 1.85 |
| 25 | 1.05 to 1.93 | 0.5 | 1.7 |
| 30 | 1.22 to 1.72 | 0.55 | 1.5 |
| 35 | — | 1.1 | 1.3 |

Simulation Evaluation 6

For simulation evaluation, a structure was set as Comparative Example 1, where a polarizer, a first retardation film and a reflective plate were sequentially arranged.

For simulation evaluation, a structure was set as Example 1, where a polarizer, a second retardation film (a constant tilt film comprising rod-shaped liquid crystal molecules having refractive index anisotropy of 0.12, and having a thickness of 0.9 μm and a tilt angle of 45°), a first retardation film and a reflective plate were sequentially arranged. The polarizer of Example 1 is a structure in which a TAC film having no retardation is laminated. For simulation evaluation, a structure was set as Example 2, where a polarizer, a second retardation film (a constant tilt film comprising disc-shaped liquid crystal molecules having refractive index anisotropy of −0.12, and having a thickness of 1.2 μm and a tilt angle of 25°), a first retardation film and a reflective plate were sequentially arranged. The polarizer of Example 2 is a structure in which a TAC film having thickness direction retardation (Rth) of −30 nm is laminated.

The method of Simulation Evaluation 1 was set except for the matters specified above. For Comparative Example 1, Example 1 and Example 2, the reflectance was measured at 60 degree side based on the front according to azimuth angles of 0 to 360 degrees, and the results were shown in FIG. 6 (Comparative Example 1), FIG. 7 (Example 1) and FIG. 8 (Example 2). From FIGS. 6 to 8, it can be confirmed that Examples 1 and 2 have low omnidirectional reflectance at the 60 degree side as compared with Comparative Example 1.

Simulation Evaluation 7

For simulation evaluation, a structure was set, where a polarizer, a second retardation film (a constant tilt film comprising a disc-shaped liquid crystal molecules having refractive index anisotropy of −0.01, and having a thickness of 2.1 μm and a tilt angle of 30°), a first retardation film and a reflective plate were sequentially arranged. As the reflective plate, a reflective plate having a reflectance of 100% in all the wavelengths of visible light was used. Five samples were set, where they were disposed so that the angles, in which the projection of the optical axis of the second retardation film onto the plane formed with the absorption axis of the polarizer, were 0 degrees, 4 degrees, 8 degrees, 12 degrees and 16 degrees, respectively.

The method of Simulation Evaluation 1 was set except for the matters specified above. For the five samples, the average reflectance was measured at 60 degree side based on the front according to azimuth angles of 0 to 360 degrees, and the results were described in Table 6 below and FIG. 9. It can be confirmed that Sample 1 having an angle of 0 degrees formed by the projection of the optical axis of the second retardation film onto the plane with the absorption axis of the polarizer has a low omnidirectional reflectance at the 60 degree side as compared with Samples 2 to 5 having the angles of 4 degrees, 8 degrees, 12 degrees and 16 degrees, respectively.

TABLE 6

| Sample | Angle with absorption axis of polarizer (°) | Average reflectance (%) |
|---|---|---|
| 1 | 0 | 0.5 |
| 2 | 4 | 4 |
| 3 | 8 | 9 |
| 4 | 12 | 15 |
| 5 | 16 | 22 |

EXPLANATION OF REFERENCE NUMERALS AND SYMBOLS

10: first retardation film 20: second retardation film 30: polarizer
R: rod-shaped liquid crystal molecule D: disc-shaped liquid crystal molecule T: tilt angle
40: C plate 100: optical filter 200: organic light-emitting display panel

The invention claimed is:

1. An optical filter for anti-reflection comprising:
a first retardation film having an in-plane optical axis and having quarter-wave phase retardation characteristics;
a second retardation film having an optical axis constantly tilted along the thickness direction, and;
a polarizer having an absorption axis formed in one direction,
wherein the first retardation film, second retardation film, and polarizer are disposed sequentially,
wherein a tilt angle of the optical axis of the second retardation film is 10 degrees to 65 degrees, and wherein the tilt angle is a minimum angle formed between the optical axis of the retardation film and a plane of the retardation film.

2. The optical filter according to claim 1, wherein the optical axis of the first retardation film forms an angle of 40 degrees to 50 degrees with the absorption axis of the polarizer.

3. The optical filter according to claim 1, wherein the projection of the optical axis of the second retardation film onto the plane is parallel to the absorption axis of the polarizer.

4. The optical filter according to claim 1, wherein the first retardation film has an in-plane retardation of 120 nm to 160 nm for light having a wavelength of 550 nm.

5. The optical filter according to claim 1, wherein the first retardation film satisfies Equation 2 below:

$$R(450)/R(550) < R(650)/R(550) \qquad [\text{Equation 2}]$$

wherein, R (λ) is an in-plane retardation of the retardation film for light of λ nm.

6. The optical filter according to claim 1, wherein the second retardation film comprises a liquid crystal layer.

7. The optical filter according to claim 6, wherein the liquid crystal layer comprises liquid crystal molecules having an absolute value of refractive index anisotropy of 0.01 to 0.25.

8. The optical filter according to claim 6, wherein the liquid crystal layer comprises rod-shaped liquid crystal molecules.

9. The optical filter according to claim 8, wherein the optical axis of the second retardation film has a tilt angle of 25 degrees to 65 degrees and the second retardation film has a thickness of 0.35 μm to 2.2 μm.

10. The optical filter according to claim 9, wherein the optical axis of the second retardation film has a tilt angle of 35 degrees to 50 degrees and the second retardation film has a thickness of 0.4 μm to 2.2 μm.

11. The optical filter according to claim 6, wherein the liquid crystal layer comprises disc-shaped liquid crystal molecules.

12. The optical filter according to claim 11, wherein the optical axis of the second retardation film has a tilt angle of 10 degrees to 35 degrees and the second retardation film has a thickness of 1 μm to 3 μm.

13. The optical filter according to claim 1, further comprising a C plate on the outer side of the first retardation film.

14. The optical filter according to claim 1, further comprising an antireflection layer on the outer side of the polarizer.

15. An organic light-emitting device comprising the optical filter of claim 1 and an organic light-emitting display panel.

16. The organic light-emitting device according to claim 15, wherein the first retardation film of the optical filter is disposed adjacent to the organic light-emitting display panel as compared with the polarizer.

* * * * *